United States Patent
Ramesh et al.

(10) Patent No.: US 6,876,936 B2
(45) Date of Patent: Apr. 5, 2005

(54) MEASUREMENT OF INDUCTANCE USING A DIGITAL STORAGE OSCILLOSCOPE UNDER REAL-TIME OPERATING ENVIRONMENTS

(75) Inventors: P. E. Ramesh, Bangalore (IN); Srikrishna Nadig, Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/628,022

(22) Filed: Jul. 25, 2003

(65) Prior Publication Data

US 2005/0021255 A1 Jan. 27, 2005

(51) Int. Cl.$^7$ ............... G06F 19/00; G01R 13/00
(52) U.S. Cl. ............... 702/66; 702/64; 324/600; 324/654
(58) Field of Search ............... 702/57, 64–68, 702/70, 73, 80, 127, 71, 74, 117, 124–126, 189, 193, 198; 324/600, 654, 522, 546, 547, 76.11, 76.12, 76.15–76.18, 207.15

(56) References Cited

U.S. PATENT DOCUMENTS 3,904,859 A * 9/1975 Poncelet ............... 702/65
2002/0180458 A1 * 12/2002 Ho et al. ............... 324/623

* cited by examiner

*Primary Examiner*—Patrick Assouad
*Assistant Examiner*—Manuel L. Barbee
(74) *Attorney, Agent, or Firm*—Thomas F. Lenihan

(57) ABSTRACT

A method and apparatus for measuring inductance. The method and apparatus include processing current and voltage waveform data associated with an inductive device to determine edge and slope parameters for each of a plurality of current waveform data cycles. Furthermore, proportional magnetic flux and proportional magnetic current is determined from the acquired current waveform data and the voltage waveform data proximate determined edge regions of the waveform data. An inductance value of the inductive device may then be calculated from the proportional magnetic flux and proportional magnetic current.

20 Claims, 5 Drawing Sheets

MEASUREMENT OF INDUCTANCE USING A DIGITAL STORAGE OSCILLOSCOPE UNDER REAL-TIME OPERATING ENVIRONMENTS

FIELD OF INVENTION

The present invention relates to inductance measuring devices, and more specifically, to measuring inductance with a digital storage measuring device.

BACKGROUND OF INVENTION

The characteristics of an inductor are dependent on the current and voltage source excitation signal, wave shape, and frequency of operation, which may vary in real time operating conditions. Inductance measuring devices typically utilize simulation techniques, such as subjecting the inductor to a known excitation signal having a controlled current and voltage source, wave shape, and frequency of operation to measure the inductance.

One type of inductance measuring device is a multifunction meter, such as an inductance/capacitance/resistance (LCR) meter. The LCR meter uses a principle of a balancing bridge or an auto balancing bridge. The measurement device excites the inductor using built-in signal generator and bridge balancing technique to measure the value of impedance of the inductor. Specifically, in an LCR meter, the signal source is a sinusoidal wave, whereas in a real operating environment, the signal may be a square wave with a high voltage and a high current component.

However, real operating signals are dependent on the wave-shape, excitation level, and operating frequency of the source, as well as the external factors from other circuit elements and the surrounding environment. Therefore, it is desirable for power supply designers and others to be able to measure and observe the behavior of an inductor in a dynamically changing environment of a power supply.

One technique for measuring inductance under a real time environment is by calculating the slope of the B-H curve (where B is magnetic flux and H is the magnetizing current). Plotting the B-H curve and measuring the slope of the curve is a complex process, since each step requires careful and correct manual analysis.

The B-H curve may be plotted in a digital storage oscilloscope (DSO) that supports XY display mode. However, a user must provide correct signals to the DSO. Specifically, generating the B signal requires an external hardware circuit that integrates the voltage with a known time constant ($\sqrt{V}dt$), which represents the magnetic flux B.

Currently, none of the digital storage oscilloscopes available in the market have a scope resident feature capable of analyzing the plot data and giving the results extracted from the plot. Therefore, there is a need in the art for a digital storage oscilloscope having built-in capabilities for observing the behavior of the inductor in a dynamically changing (real-time) operating environment.

SUMMARY OF INVENTION

The disadvantages heretofore associated with the prior art are overcome by the present invention of a method and apparatus for measuring inductance. The method and apparatus include processing current and voltage waveform data associated with an inductive device to determine edge and slope parameters for each of a plurality of current waveform data cycles.

Furthermore, proportional magnetic flux and proportional magnetic current is determined from the acquired current waveform data and the voltage waveform data proximate determined edge regions of the waveform data. An inductance value of the inductive device may then be calculated from the proportional magnetic flux and proportional magnetic current.

BRIEF DESCRIPTION OF THE DRAWINGS

The teachings of the present invention can be readily understood by considering the following detailed descriptions in conjunction with the accompanying drawings, in which.

To facilitate understanding, identical reference numerals have been used, where possible, to designate identical elements that are common to the drawings.

DETAILED DESCRIPTION OF THE INVENTION

The present invention comprises a method and apparatus for performing in-circuit inductance measurements, as well as observing the behavior of an inductor in a real-time operating environment. Specifically, voltage and current waveform data associated with an inductive device (e.g., of a switching power supply) is acquired to determine the average (proportional) magnetizing flux (B) and magnetizing current (H) inductance of such inductive device under real-time operating conditions. The slope of the proportional B-H data is then calculated to determine the real-time inductance of the inductor being measured.

The present invention is discussed in terms of an inductance measurement software tool, such as a TDSPWR2 inductance measurement tool produced by Tektronix, Inc. of Beaverton, Oreg. The exemplary power-measurement program tool is installed (i.e., stored) in local memory of a digitizing test and measurement device, such as a digital storage oscilloscope (DSO) (e.g., a Tektronix, Inc. model TDS5000, TDS6000, and TDS7000 series oscilloscopes, or other DSO/acquisition devices) to transform the DSO into an analysis tool that quickly measures and analyzes real-time inductance in a circuit, such as a power-supply. A DSO implementing the present invention optionally generates detailed test reports in customizable formats. However, one skilled in the art will appreciate that the teachings discussed herein may be implemented in other a digitizing measurement devices.

Figure 1:
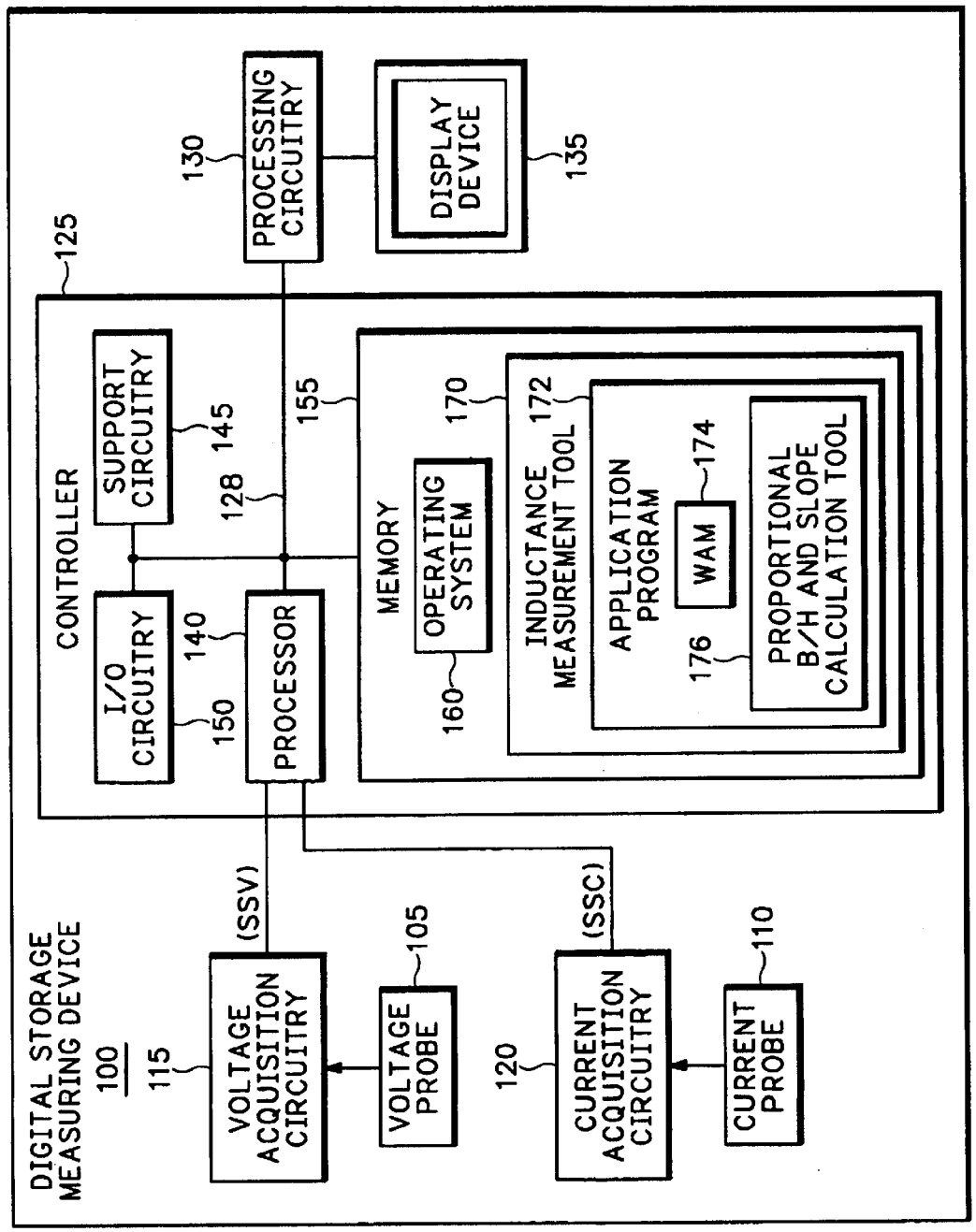
FIG. 1 depicts a high level block diagram of an exemplary digital storage measuring device having an inductance measurement tool of the present invention.

FIG. 1 depicts a high level block diagram of an exemplary digital storage measuring device having an inductance measurement tool of the present invention. In particular, the exemplary oscilloscope 100 of the present invention utilizes a voltage probe 105 and a current probe 110, and comprises voltage acquisition circuitry 115, current acquisition circuitry 120, a controller 125, processing circuitry 130, and a display device 135. The voltage probe 105 and current probe 110 may be any conventional voltage or current probes suitable for respectively detecting analog voltage and current signals from the exemplary inductor.

For example, the probes 110 may be provided by Tektronix, Inc., such as active probe model numbers P5205, TCP202, among others, which may be used to acquire real time signal information. However, one skilled in the art will appreciate that other conventional voltage and current probes may also be utilized to detect voltage and current signals from a particular element in a circuit. The output of the voltage probe 105 and current probe 110 are respectively sent to the voltage 115 and current 120 acquisition channel circuitry. It is noted that the current probe 110 may be realized using a voltage probe in conjunction with a reference resistor.

The voltage acquisition circuitry 115 and current acquisition circuitry 120 each comprise, illustratively, analog-to-digital conversion circuitry, triggering circuitry, decimator circuitry, supporting acquisition memory, and the like. Acquisition circuitry 115 and 120 operate to digitize, at a sample rate, "S", one or more of the signals under test to produce one or more respective acquired sample streams suitable for use by the controller 125 and/or the processing circuitry 130. The acquisition circuitry 115 and 120, in response to commands received from the controller 125, operates to change trigger conditions, decimator functions, and other acquisition related parameters. The acquisition circuitry communicates the resulting sample stream (e.g., SSV and SSC) to the controller 125.

The controller 125 operates to process the one or more acquired sample streams provided by the acquisition circuitry 115 and 120 to generate respective waveform data associated with one or more sample streams. That is, given desired time per division and volts per division display parameters, the controller 125 operates to modify or rasterize the raw data associated with an acquired sample stream to produce corresponding waveform data having the desired time per division and volts per division parameters. The controller 125 may also normalize waveform data having non-desired time per division, volts per division, and current per division parameters to produce waveform data having the desired parameters. The controller 125 provides the waveform data to the processing circuitry 130 for subsequent presentation on the display device 135.

The controller 125 of FIG. 1 comprises a plurality of components including at least one processor 140, support circuits 145, I/O circuitry 150, memory 155, and one or more communication buses 128 for providing communications between the controller components. The processor 140 cooperates with conventional support circuitry 145, such as power supplies, clock circuits, cache memory, and the like, as well as circuits that assist in executing software routines stored in the memory 155. As such, it is contemplated that some of the process steps discussed herein as software processes may be implemented within hardware, for example, as circuitry that cooperates with the processor 140 to perform various steps. The controller 125 also contains input/output (I/O) circuitry 150 that forms an interface between the various function elements communicating with the controller 125.

For example, the I/O circuitry 150 may comprise a keypad, pointing device, touch screen, or other means adapted to provide user input and output to the controller 125. The controller 125, in response to such user input, illustratively adapts the operations of the acquisition circuitry 115 and 120 to perform various data acquisitions, triggering, processing, display communications, among other functions. In addition, the user input may be used to trigger automatic calibration functions and/or adapt other operating parameters of the display device 135, logical analysis, or other data acquisition devices.

The memory 155 may include volatile memory, such as SRAM, DRAM, among other volatile memories. The memory 150 may also include non-volatile memory devices, such as a disk drive or a tape medium, among others, or programmable memory, such as an EPROM, among others. The memory 155 stores the operating system 160 of the measurement device (DSO), and the inductance measurement program tool 170 of the present invention, which includes an application program 172 comprising a waveform analysis module (WAM) 174 and B/H (Proportional B and H) and Slope Calculation tool 176.

The WAM 174 is used to find the edges on the waveform based on the slope of the transition on the current waveform. Furthermore, the B/H (Proportional B and H) and Slope Calculation tool 176 is used to calculate the proportional B, H values as well as slope to determine the value of inductance. Both the WAM 174 and B/H (Proportional B and H) and Slope Calculation tool 176 are discussed below in further detail with respect to FIGS. 5 and 6.

Although the controller 125 of FIG 1 is depicted as a general purpose computer that is programmed to perform various control functions in accordance with the present invention, the invention may be implemented in hardware such as, for example, an application specific integrated circuit (ASIC). As such, it is intended that the processor described herein be broadly interpreted as being equivalently performed by hardware, software, or a combination thereof.

It will be appreciated by those skilled in the art that standard signal processing components (not shown), such as signal buffering circuitry, signal conditioning circuitry, and the like are also employed as required to enable the various functions described herein. For example, the voltage acquisition circuitry 115 and current acquisition circuitry 120 sample the signals under test at a sufficiently high rate to enable appropriate processing by the controller 125 and/or the processing circuitry 130.

In one embodiment, the acquisition circuitry 115 and 120 provide a trigger enable signal to an optional trigger controller (not shown). The trigger enable signal is asserted in response to a determination by circuitry within the acquisition circuits 115 and 120 when a desired triggering event, such as a particular sequence of logic levels indicative of a portion of a data word and the like has been received via the signals in the test. The desired triggering event(s) may comprise any combinatorial and/or sequential logic function applied to the signals and test received by either of the acquisition circuits 115 or 120. The specific trigger events are supplied to the acquisition circuits 115 and 120 via the controller 125.

The processing circuitry 130 comprises data processing circuitry suitable for converting acquired sample streams or waveform data into image or video signals, which are adapted to provide visual imagery (e.g., video frame memory, display formatting and driver circuitry, and the like). The processing circuitry 130 may include the display device 135 (e.g., built-in DSO display device) and/or provide output signals (e.g., via a video driver circuit) suitable for use by an external display device 135.

The processing circuitry 130 is optionally responsive to the controller 135 and the various parameters, such as vertical (e.g., volts per division) and horizontal (e.g., time per division) display parameters, as well as user interface imagery (e.g., user prompts, diagnostic information and the like). It will be appreciated by those skilled in the art that within the context of a data acquisition system utilizing many acquisition devices 115 and 120, it is not necessary to include display circuitry 130 and a display device 135 in each of the acquisition devices 115 and 120. Moreover, in the case of the acquisition circuitry comprising modules or cards inserted within a computing device, or arranged using a back plane, a single processing circuit 130 and display device 135 may provide an image processing function for any one (or more) of the acquisition circuits.

Figure 2:
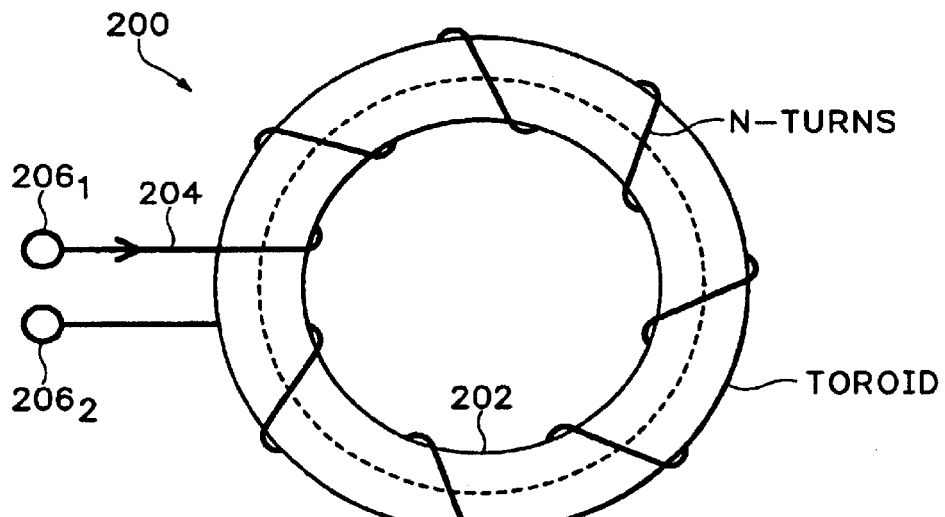
FIG. 2 depicts a top-view of an exemplary inductor device suitable for being measured by the inductance measuring tool of FIG. 1.

FIG. 2 depicts a top-view of an exemplary inductor device 200 suitable for being measured by the inductance measuring device 100 of FIG. 1. The exemplary inductor device 200 is a toroidal core inductor having a ring shaped ferromagnetic core 202, and a conductive wire 204 wound around the core ring 200 having N-turns, where N is an number greater than 1. Current (I) flows through a first end 206$_1$ of the wire 204, around the core 202 at each of the N turns, and out a second end 206$_2$ of the wire 204. The exemplary toroidal core inductor 200 of FIG. 2 is one of many types of inductive devices that the may have its inductance measured by the inductance measurement device 100 of the present invention. Accordingly, the toroidal core inductor 200 should not be considered as being limiting.

The inductance (L) of the coil 200 may be derived as a function of variations of the flux φ, as well as the current through the wire 204. The inductance of a coil is also a measure of the instantaneous change in flux linking a coil due to an instantaneous change in current through the coil. That is, $$L = N \frac{d\phi}{di}$$

(Henries, (H)), where N=number of turns, φ=flux in Webers, and i=current through the coil. Thus, the larger the inductance of a coil (with N being fixed), the larger will be the instantaneous change in flux linking the coil due to an instantaneous change in current through the coil.

The instantaneous electromagnetic force (emf) induced in the coil is $$e_L = -n \frac{d\phi}{dt}$$

volts (V)). Thus, the greater the rate of change of current through the coil, the greater will be the induced voltage. Furthermore, since $$\phi = \frac{1}{N} \int -e \, dt,$$

the inductance L may be derived by the expression $$L = \frac{\int -e \, dt}{I}$$

Henry.

Figure 3:
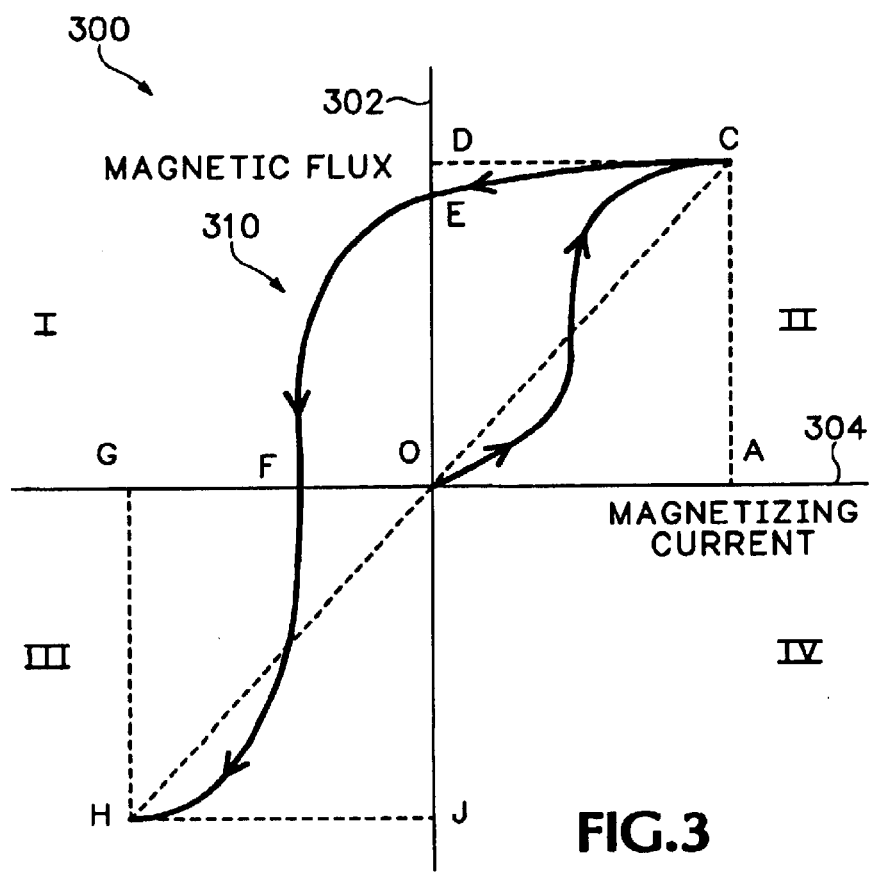
FIG. 3 depicts a graphical representation of an exemplary hysteresis curve for the inductor device of FIG. 2.

FIG. 3 depicts a graphical representation of an exemplary variation of magnetic flux with magnetic current curve 300. The curve 300 may be representative of the inductor device 200 of FIG. 2, and be viewed on the display device 135 of the digital storage measuring device 100 of FIG. 1. The curve 300 comprises an ordinate 302 representing magnetic flux φ, and an abscissa 304 representing magnetizing current (I). When an alternating current (AC) signal flows through an inductor, such as the toroidal inductor of FIG. 2, the curve 310 is formed. The shape of curve 310 represents an AC signal that varies from the peak (maximum) amplitude in one polarity and to the same maximum amplitude in the reverse polarity. Consequently, there may be an infinite number of instantaneous inductance values, depending upon the particular variation of current.

The curve 310 starts at the origin "O" when the source (excitation) AC signal has an amplitude of zero, and increases to point "C" representing a positive peak current and thus, a point of maximum magnetic flux and magnetizing current. As the source AC signal reverses, the amplitude of the flux and magnetizing current also decrease. When the AC signal reaches the maximum negative current level (i.e., negative peak) the curve 310 decreases to point "H", representing negative peak current, and thus, a point of maximum magnetic flux and magnetizing current having an opposite polarity.

It is noted, that the inductance of the coil may be computed from the curve 300 of FIG. 3. Referring to FIG. 3, the value of the inductance of the coil is considered as the ratio of change of magnetic flux linkages to the change of the current when the current is reversed (i.e., one complete cycle). Accordingly, L=(DJ/AG)N, where D and J represents the maximum magnetic flux values at the respective positive and negative peaks of the AC signal, A and G represent the maximum magnetizing current values at the respective positive and negative peaks of the AC signal, and N is the number of turns. One skilled in the art will appreciate that this inductance value is the same as one obtained by varying the flux linearly along the line COH of FIG. 2. Line COH of FIG. 2 represents the slope of the data plotted in FIG. 2, which is equivalent to the above derived equation $$L = \frac{\int -e \, dt}{I}.$$

Accordingly, and as will be discussed in further detail below with respect to FIGS. 4–6, the inductance of an inductor may be found by measuring the data points of both the voltage across and current flowing in the inductor during circuit operation.

Figure 4:
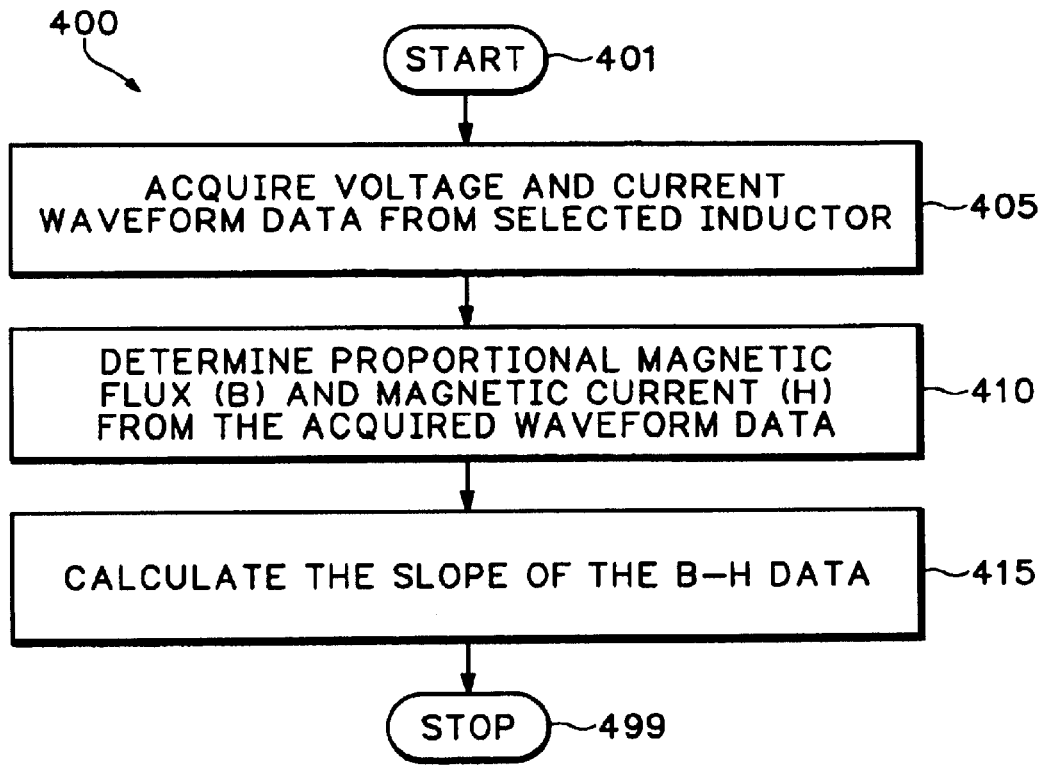
FIG. 4 depicts a flow-diagram of a method for determining in-circuit inductance measurements and observing the behavior of an inductor in a real-time operating environment.

FIG. 4 depicts a flow-diagram of a method 400 of determining in-circuit inductance measurements and observing the behavior of an inductor in a real-time operating environment. The method 400 starts at step 401, where the exemplary digital storage measurement device (e.g., DSO) 100 of the present invention is coupled across an inductor, such as the toroidal inductor of FIG. 2, via probes voltage probe 105. The method 400 then proceeds to step 405.

At step 405, the exemplary digital storage measurement device 100 of the present invention acquires data samples representing the voltage across and current through a selected inductor in a circuit being measured by the measurement device 100. The DSO 100 then converts the acquired sample streams to respective waveform data.

In particular, the DSO 100 converts the analog switching signals from the inductor 200 into a digital representation by sampling, optionally decimating, and storing a plurality of voltage and current waveform data cycles, as illustratively shown and discussed below with respect to FIG. 5. The acquired sample streams are rasterized to facilitate viewing of the respective waveform data, and a record of cycles associated with the current and voltage waveform data is stored in a buffer of the DSO.

In particular, the voltage and current waveform data cycles are stored by the DSO to form an historical record of the current and voltage cycles propagating over the inductor 200 over a selected interval of time. The number of cycles stored (i.e., the historical record) may be set by an operator in a range of a single cycle to hundreds of cycles. The record may be continuous or temporally proximate to a trigger event. The method 400 then proceeds to step 410.

At step 410, the inductance measurement tool 170 determines proportional magnetic flux (B) and magnetic current (H) from the waveform data. Details of step 410 are illustratively discussed below with respect to FIG. 6. At step 415, magnetic flux and current (B-H) data is plotted (as shown in FIG. 3), such that the slope of the B-H data may be calculated to determine the inductance of the inductor in a real time circuit environment. The method 400 then proceeds to step 499, where the method 400 ends.

Figure 5:
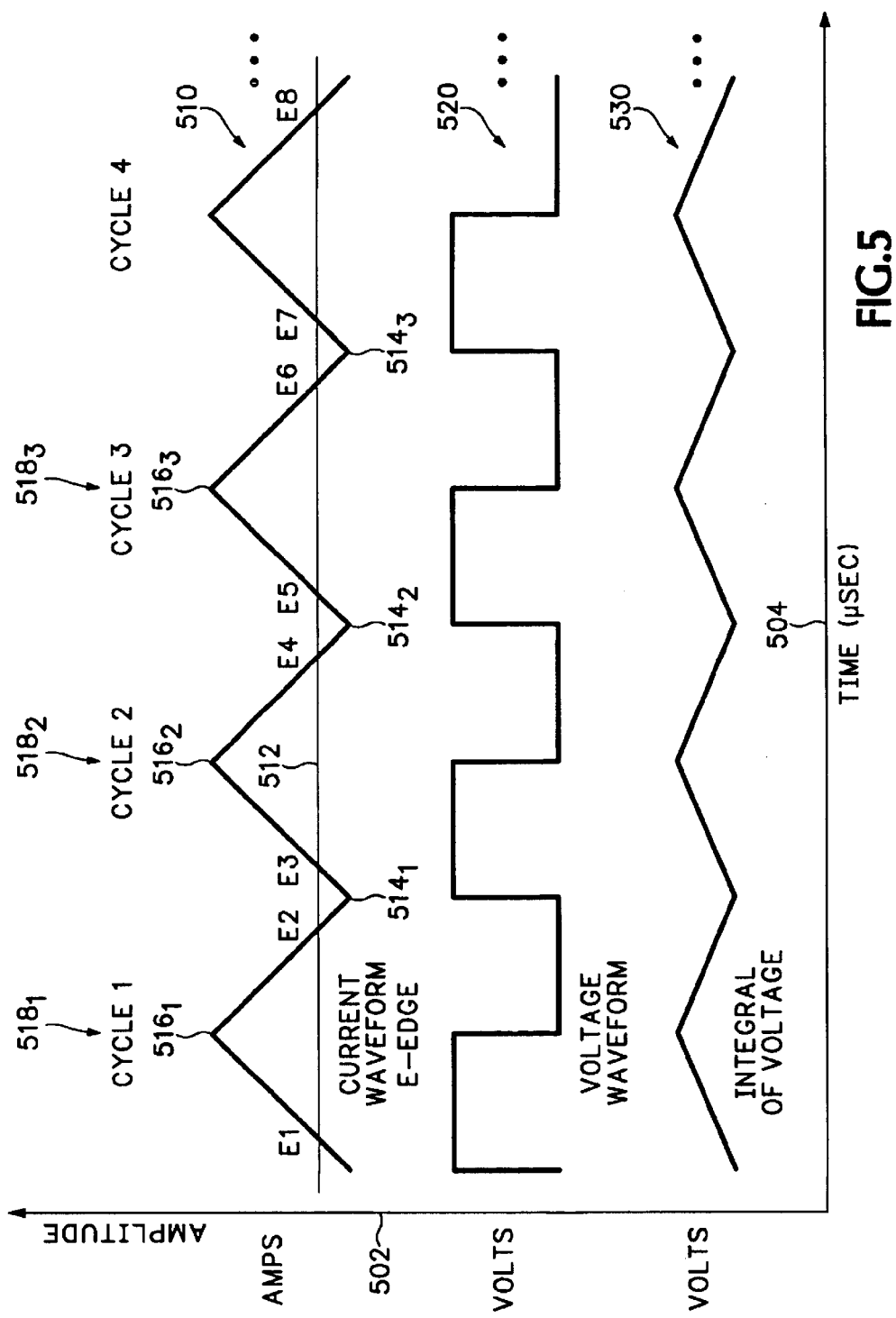
FIG. 5 depicts a graphical representation of a plurality of waveform data acquired by the digital storage measuring device of FIG. 1.

FIG. 5 depicts a graphical representation of a plurality of waveform data acquired by the measurement tool of FIG. 1. Specifically, FIG. 5 depicts a graphical representation of current waveform data 510, voltage waveform data 520, and an integral of voltage waveform data 530. It is noted that the current and voltage waveform data 510 and 520 are acquired in step 405 of method 400 of FIG. 4. The integral voltage waveform data 530 is computed by the waveform analysis module 174, as discussed below in further detail with respect to FIG. 6.

The graphical representations of the voltage and current waveforms are illustratively buffered and displayed on the display device 135 of the oscilloscope 100 by coupling the voltage and current probes 105 and 110 across the first and second ends $206_1$ and $206_2$ of the inductive wire 204. As discussed above with respect to FIG. 1, the processing circuitry 130 samples the analog signal from the inductor 200 and forms the digital representation of the signal as a frame having a plurality of cycles, which form a record of the waveforms. Typically, the oscilloscope 100 is set to store a large record (i.e., hundreds) of cycles.

Referring to FIG. 5, the ordinate 502 represents the amplitude of the current and voltage waveform data (i.e., amps and volts), while the abscissa 504 represents time (e.g., microseconds or nanoseconds). Three waveforms are illustratively shown in FIG. 5, with the first waveform data positioned above the second waveform data, and the second waveform data 520 positioned above the third waveform data 530.

The first exemplary waveform data represents the current waveform data 510, and is depicted as a triangle waveform. The second exemplary waveform data represents the voltage waveform data 520, which is depicted as a square waveform. The third exemplary waveform data represents the integral voltage waveform data 530 of the voltage waveform data 520, and is also shaped as a triangle waveform. Each of the three waveform data 510, 520, and 530 illustratively show four in-phase cycles of the plurality of cycles in the record. It is noted that the four cycles for each waveform data are illustratively shown for simplicity and better understanding of the invention. Accordingly, the number of cycles shown should not be considered as being limiting.

It is further noted that the wave shape of the current waveform data 510 and voltage data waveform 520 depend on circuit operation, operating voltage. Here the voltage is square in shape due to the switching power supply behavior. The current wave shape cannot follow the voltage wave shape due to the behavior of the inductance. The rate of rise of current through the inductor depends upon L/R where R is the resistance of the inductor. It is noted that additional aspects of FIG. 5 are discussed with respect to FIG. 6.

Figure 6:
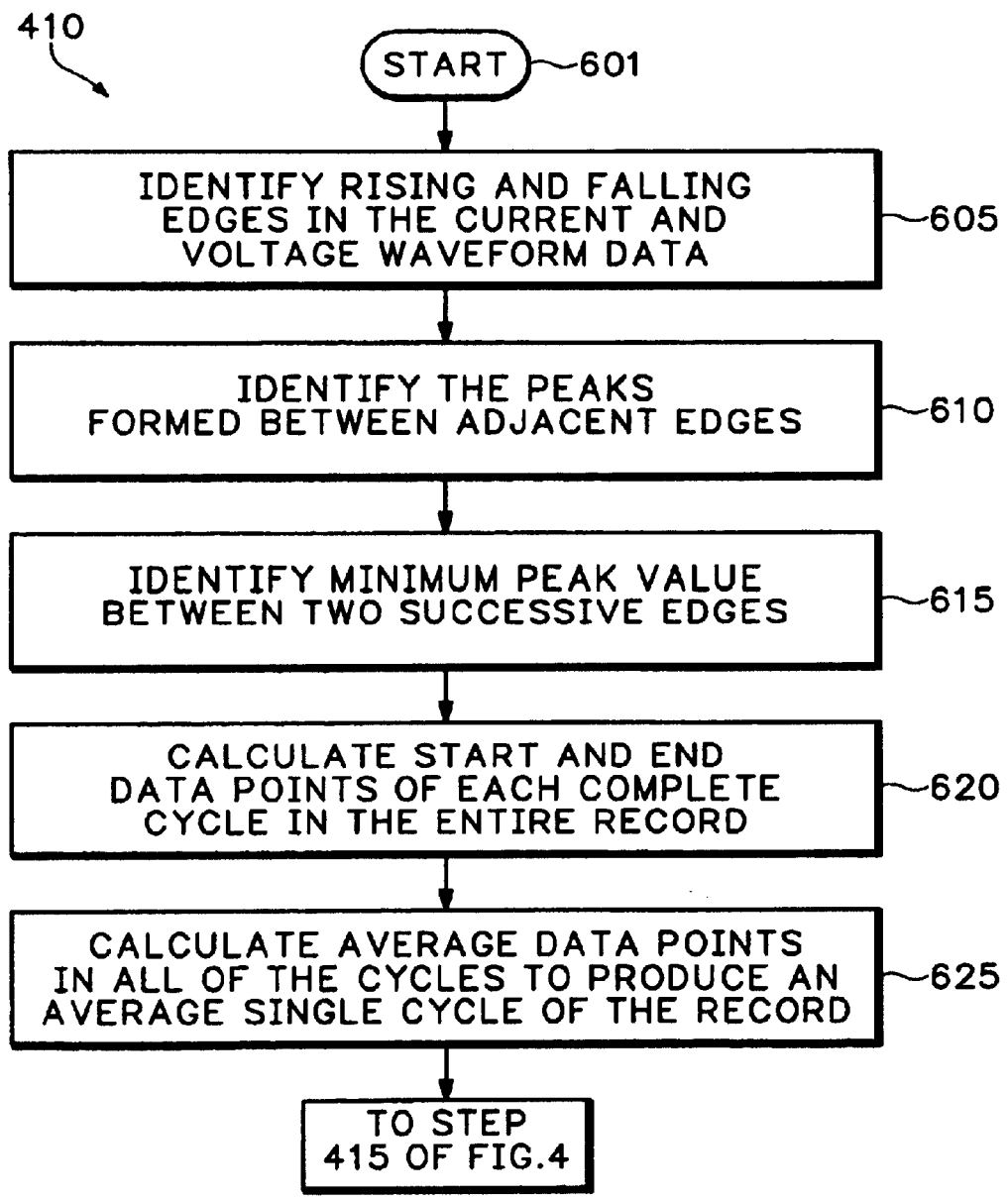
FIG. 6 depicts a flow-diagram of a method for determining proportional flux (B) and proportional magnetic current (H) data from the waveform data of FIG. 5.

FIG. 6 depicts a flow-diagram of a method 410 for determining proportional flux (B) and proportional magnetic current (H) data from the waveform data of FIG. 5. In particular, method 410 starts at step 601 and proceeds to step 605, where the rising and falling edges (E) of the current and voltage waveform data are identified. The waveform analysis module 274 may be used to identify edges of both the voltage waveform and current waveform data 510 and 520 by determining at least one of the rising and falling slopes of each waveform. In one embodiment of the invention, both the rising and falling edges of the current waveform are determined using the current waveform data directly. In an alternate embodiment, only one of the edges is identified directly, while the other edge is estimated. In still another embodiment of the invention, the waveform data associated with the voltage waveform is evaluated to determine edge regions or zones.

Referring to FIG. 5, the current waveform data 510 is illustratively measured at the ten (10) percent level 512 of the current waveform data 510. That is, the exemplary edges E1–E8 are identified at the 10 percent level 512 of the current waveform, where the odd numbered edges E1, E3, E5 and so forth represent rising edges, while the even numbered edges E2, E4, E6 and so forth represent falling (declining) edges of the current data waveform.

In particular, edge E1 $512_1$ has a rising slope indicating that the current through the inductor core has a positive polarity, while edge E2 has a declining slope indicating that the current through the inductor has a negative polarity. Furthermore, edge E3 also has a rising slope, thereby indicating that the current through the inductor core again has a positive polarity, and so forth.

Accordingly, the waveform analysis module 174 tracks changes in the slope of the current waveform data 510 to determine the beginning and end of each transition (i.e., edge). As discussed above, a plurality of consecutive cycles representing the current and voltage waveform data 510 and 520 are stored in a buffer (not shown) having a predetermined record length to provide historical information for viewing. Accordingly, data useful in defining the temporal location at the edges are identified for each of the cycles stored in the buffer therein. The method then proceeds to step 610.

At step 610, the peaks formed between adjacent edges of the current waveform data 510 are identified. In the triangular shaped current waveform data 510, the peaks are identified where the slope of each edge changes. Referring to FIG. 5, a first high peak $516_1$ is identified, followed by a first low peak $514_1$. A second high peak $516_2$ is formed after the first low peak $514_1$, and a second low peak $514_2$ follows the second high peak $516_2$. A third high peak $516_3$ is formed after the second low peak $514_2$, and a third low peak $514_3$ follows the third high peak $516_3$, and so forth. The method 410 then proceeds to step 615.

At step 615, the WAM 174 finds the data points of the start and end of each cycle of the current waveform 510 through the inductor core, by identifying the peaks between two successive low edge indicators on the current waveform 510. Referring to FIG. 5, the first low peak 514$_1$, is identified between the edges E2 and E3, the second low peak 514$_2$ is identified between the edges E4 and E5, the third low peak 514$_3$ is identified between the edges E6 and E7, and so forth. The method 410 then proceeds to step 620.

At step 620, the B/H (Proportional B and H) and Slope Calculation tool 176 calculates the start and end data point of each complete cycle in the entire record. As shown in FIG. 5, a plurality of cycles 518$_1$, 518$_2$, 518$_3$, and so forth (collectively current cycles 518) are illustratively depicted. That is, more than one cycle 516 has illustratively been acquired in the acquisition record. It is noted that the start of the first cycle depends upon the trigger level and trigger position during the acquisition on the DSO 100. Each identified minimum peak value 514 indicates a starting point for the next consecutive cycle and the end point of the previous cycle, where the data points between two successive low peaks 514 define one complete cycle 516. For example, low peaks 514$_1$ and 514$_2$ define cycle 2 518$_2$ in the acquisition record. The method 410 then proceeds to step 625.

At step 625, the data points of each cycle 518 are averaged to obtain an average single cycle of the acquisition record. Step 625 is performed for each of the waveform data 510, 520, and 530 in the record. Thus, a single cycle for each of the current, voltage, and integral voltage waveform data is determined, where each single average cycle represents the average data points of each waveform data in the acquisition record.

Figure 7:
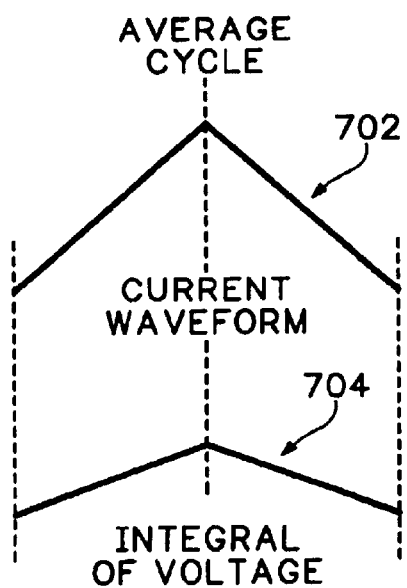
FIG. 7 depicts a graphical representation of an averaged current waveform data cycle and an average integral of voltage waveform data.

FIG. 7 depicts a graphical representation of an averaged current waveform data cycle 702 and an average integral of voltage waveform data 704. Referring to FIG. 3, the averaged current waveform data cycle 702 represents the proportional current H, while the integral of voltage waveform data cycle 704 represents the proportional flux B. The average data points of the average current cycle 702 increase with respect to the positive width of the integral voltage waveform 704. Similarly, average data points of the average current cycle 702 decrease with respect to the negative width of the voltage waveform 704. Inductance is calculated for both portions of the average current cycle 702, as discussed below. The method 410 then ends and proceeds to step 415 of method 400.

At step 415, the B/H (Proportional B and H) and Slope Calculation tool 176 module calculates the slope of the proportional B-H data. Recall that the magnetic flux B is proportional to integral of the voltage V ($\sqrt{}$Vdt) and the magnetizing current H is proportional to the current 1. Referring to FIG. 2, further recall that the inductance L may be determined by the slope of the magnetic flux and current curve (e.g., points COH).

Let Y=$\sqrt{}$Vdt, and X=I (current), then, Y=LX+K, where K is a constant. Since X and Y are known for different times, in one embodiment, a "Least-Squares" (regression) algorithm is used to obtain the value of L. For example, to find $$X = \frac{\sum X_i}{N}$$

$|X|_1 = X_1 - X$, i=1 ... N, and $|Y|_1 = Y_1 - Y$, i=1 ... N.

Thus, the inductance $$L = \frac{\sum |X|_i |Y|_i}{\sum |X|_i^2},$$

where L may vary as X varies.

Accordingly, the inductance measurement program tool of the present invention may be utilized by circuit designers to perform in-circuit inductance measurement and observe the behavior of the inductor in a real time environment. More specifically, the inductance measurement tool 170 illustratively transforms a digital oscilloscope 100 into a sophisticated analysis tool that quickly measures and analyzes inductance of an inductor, illustratively in a power supply circuit, and then generates detailed test reports in customizable formats.

Measuring an inductance value is based on the analysis using a B-H curve. Specifically the inductance measurement tool 170 acquires the current and voltage across the inductor, and transforms the acquired current and voltage into an averaged current signal and an integral of voltage representing proportional magnetic current and proportional magnetic flux through the inductor. This solution is scope resident, automated, and helps to reduce existing complex measurement procedure. This approach helps a circuit designer or user to analyze the associated hysteresis curve and core loss measurements. Such information may be utilized by the circuit designer to analyze and debug problems, such as inefficiencies, overheating, among other problems in a circuit.

Although various embodiments that incorporate the teachings of the present invention have been shown and described in detail herein, those skilled in the art can readily devise many other varied embodiments that still incorporate these teachings.

What is claimed is:

1. A method for measuring inductance, said method being suitable for use in an oscillosocope, said method comprising the steps of:

processing current and voltage waveform data associated with an inductive device to determine edge and slope parameters for each of a plurality of current waveform data cycles;

determining proportional magnetic flux and proportional magnetic current from said acquired current waveform data and said voltage waveform data proximate determined edge regions of said waveform data; and calculating an inductance value of said inductive device from said proportional magnetic flux and proportional magnetic current.

2. The method of claim 1, wherein said processing step comprises:

acquiring said current and voltage sample streams associated with said inductive device;

rasterizing said acquired sample streams to provide respective waveform data; and storing a record of cycles associated with said current and voltage waveform data.

3. The method of claim 2, further comprising the steps of:

identifying low peaks formed between adjacent edges of said current waveform data; and defining each cycle of said current waveform data between said low peaks formed between adjacent edges.

4. The method of claim 3, where in said step of calculating said inductance value comprises the steps of:

calculating start and end data points of each complete current waveform data cycle in the record; and calculating an average cycle of said current waveform data for all data points in said record of said current waveform data.

5. The method of claim 4, further comprising the step of:

calculating an integral of voltage waveform data from said acquired waveform data.

6. The method of claim 5, further comprising the step of:

displaying imagery representing said proportional magnetic flux and proportional magnetic current associated with said average current waveform data and said integral of voltage waveform data as a proportional B and H curve.

7. The method of claim 6, further comprising the step of:

determining a slope of said proportional B and H curve.

8. The method of claim 7, further comprising the step of:

computing a regression algorithm of said slope of said proportional B and H curve to obtain said inductance value of said inductive device.

9. The method of claim 2, wherein said step of acquiring said current and voltage sample streams comprises the step of:

acquiring voltage and current waveform data via respective acquisition channels of a signal processing device.

10. The method of claim 9, wherein said signal processing device comprises one of a digital storage oscilloscope (DSO) and a data acquisition module in communication with a computing device.

11. Apparatus for measuring inductance, comprising:

means for processing current and voltage waveform data associated with an inductive device to determine edge and slope parameters for each of a plurality of current waveform data cycles;

means for determining proportional magnetic flux and proportional magnetic current from said acquired current waveform data and said voltage waveform data proximate determined edge regions of said waveform data; and means for calculating an inductance value of said inductive device from said proportional magnetic flux and proportional magnetic current.

12. The apparatus of claim 11, wherein said means for processing comprises:

means for acquiring said current and voltage sample streams associated with said inductive device;

means for rasterizing said acquired sample streams to provide respective waveform data; and means for storing a record of cycles associated with said current and voltage waveform data.

13. The apparatus of claim 12, further comprising:

means for identifying low peaks formed between adjacent edges of said current waveform data; and means for defining each cycle of said current waveform data between said low peaks formed between adjacent edges.

14. The apparatus of claim 13, where in said means for calculating said inductance value comprises:

means for calculating start and end data points of each complete current waveform data cycle in the record; and means for calculating an average cycle of said current waveform data for all data points in said record of said current waveform data.

15. The apparatus of claim 14, further comprising:

means for calculating an integral of voltage waveform data from said acquired waveform data.

16. The apparatus of claim 15, further comprising:

means for displaying imagery representing said proportional magnetic flux and proportional magnetic current associated with said average current waveform data and said integral of voltage waveform data as a proportional B and H curve.

17. The apparatus of claim 16, further comprising:

means for determining a slope of said proportional B and H curve.

18. The apparatus of claim 17, further comprising:

means for computing a regression algorithm of said slope of said proportional B and H curve to obtain said inductance value of said inductive device.

19. The apparatus of claim 12, wherein said acquiring said current and voltage sample streams comprises:

means for acquiring voltage and current waveform data via respective acquisition channels of a signal processing device.

20. The apparatus of claim 19, wherein said signal processing device comprises one of a digital storage oscilloscope (DSO) and a data acquisition module in communication with a computing device.

* * * * *